(12) United States Patent
Ikeda et al.

(10) Patent No.: US 11,081,320 B2
(45) Date of Patent: Aug. 3, 2021

(54) PLASMA PROCESSING APPARATUS, PLASMA PROCESSING METHOD, AND ECR HEIGHT MONITOR

(71) Applicant: HITACHI HIGH-TECH CORPORATION, Tokyo (JP)

(72) Inventors: Norihiko Ikeda, Tokyo (JP); Naoki Yasui, Tokyo (JP); Kazuya Yamada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/640,443

(22) PCT Filed: Mar. 6, 2019

(86) PCT No.: PCT/JP2019/008930
§ 371 (c)(1),
(2) Date: Feb. 20, 2020

(87) PCT Pub. No.: WO2020/012704
PCT Pub. Date: Jan. 16, 2020

(65) Prior Publication Data
US 2020/0286715 A1   Sep. 10, 2020

(51) Int. Cl.
*H01J 37/32* (2006.01)
*H01L 21/3065* (2006.01)

(52) U.S. Cl.
CPC .. *H01J 37/32678* (2013.01); *H01J 37/32201* (2013.01); *H01J 37/32311* (2013.01);
(Continued)

(58) Field of Classification Search
CPC ............. H01J 37/32; H01J 37/32311; H01J 37/32678; H01J 37/32201; H01J 37/224;
(Continued)

(56) References Cited

U.S. PATENT DOCUMENTS

| 4,579,623 A | 4/1986 | Suzuki et al. |
| 5,324,388 A | 6/1994 | Yamano et al. |

(Continued)

FOREIGN PATENT DOCUMENTS

| JP | 60-50923 A | 3/1985 |
| JP | H0673568 A | 3/1994 |

(Continued)

OTHER PUBLICATIONS

Office Action dated Oct. 30, 2020 in corresponding Taiwanese Application No. 109102743.

*Primary Examiner* — Thai Pham
(74) *Attorney, Agent, or Firm* — Miles & Stockbrige, P.C

(57) ABSTRACT

A plasma processing apparatus includes a processing chamber 101 where a wafer 114 is processed using plasma 111, a radio frequency power supply 106 configured to supply a radio frequency power for generating the plasma 111, a mechanism configured to form a magnetic field for forming ECR and to control a magnetic flux density thereof, and a sample stage 113 on which the wafer 114 is placed. The plasma processing apparatus further includes a control unit 107 configured to, based on image data of the plasma 111, monitor a height of ECR which is electron cyclotron resonance generated by an interaction between the radio frequency power and the magnetic field, and to control a frequency of the radio frequency power such that the monitored ECR height becomes a predetermined height.

9 Claims, 10 Drawing Sheets

(52) U.S. Cl.
CPC .... *H01J 37/32935* (2013.01); *H01L 21/3065* (2013.01); *H01J 2237/3341* (2013.01)

(58) Field of Classification Search
CPC ........ H01J 37/32935; H01J 2237/3341; H05H 1/46; H01L 21/3065
See application file for complete search history.

(56) References Cited

U.S. PATENT DOCUMENTS

| | | | |
|---|---|---|---|
| 6,528,752 B1* | 3/2003 | Ishii | H01J 37/32082 |
| | | | 118/723 AN |
| 10,312,053 B2* | 6/2019 | Ishizawa | H01J 37/22 |
| 2003/0150846 A1 | 8/2003 | Ishii et al. | |
| 2011/0034300 A1* | 2/2011 | Hall | A63B 5/11 |
| | | | 482/1 |
| 2014/0197761 A1 | 7/2014 | Grandemenge et al. | |
| 2016/0118216 A1* | 4/2016 | Doemer | H01J 37/023 |
| | | | 250/307 |
| 2016/0118219 A1 | 4/2016 | Potocek et al. | |
| 2016/0163504 A1* | 6/2016 | Takeda | H01J 37/265 |
| | | | 250/307 |
| 2020/0035445 A1* | 1/2020 | Xu | H01J 37/32082 |

FOREIGN PATENT DOCUMENTS

| | | |
|---|---|---|
| JP | H06216081 A | 8/1994 |
| JP | H07130714 A | 5/1995 |
| JP | 2001060557 A | 3/2001 |
| JP | 2005079603 A | 3/2005 |
| JP | 2014515869 A | 7/2014 |
| TW | 202008855 A | 2/2020 |

* cited by examiner

[FIG. 1]
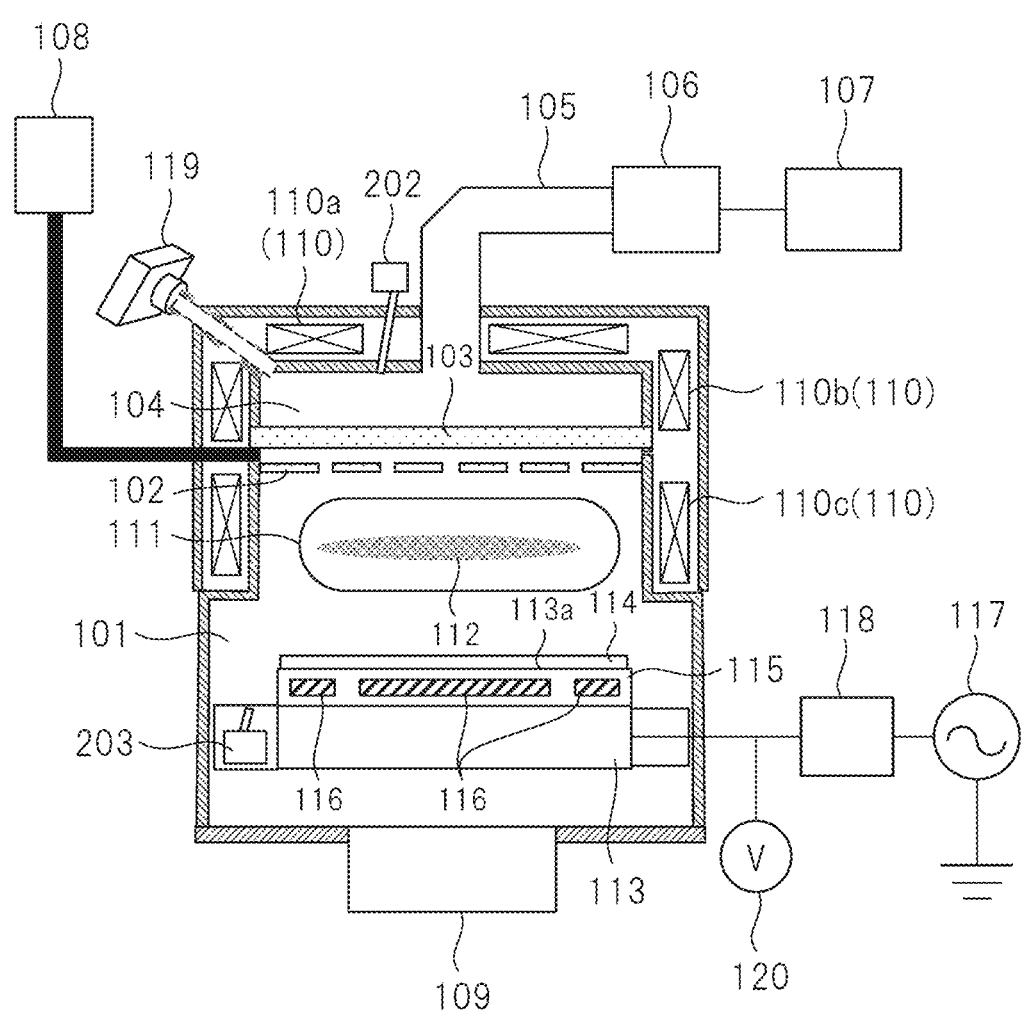

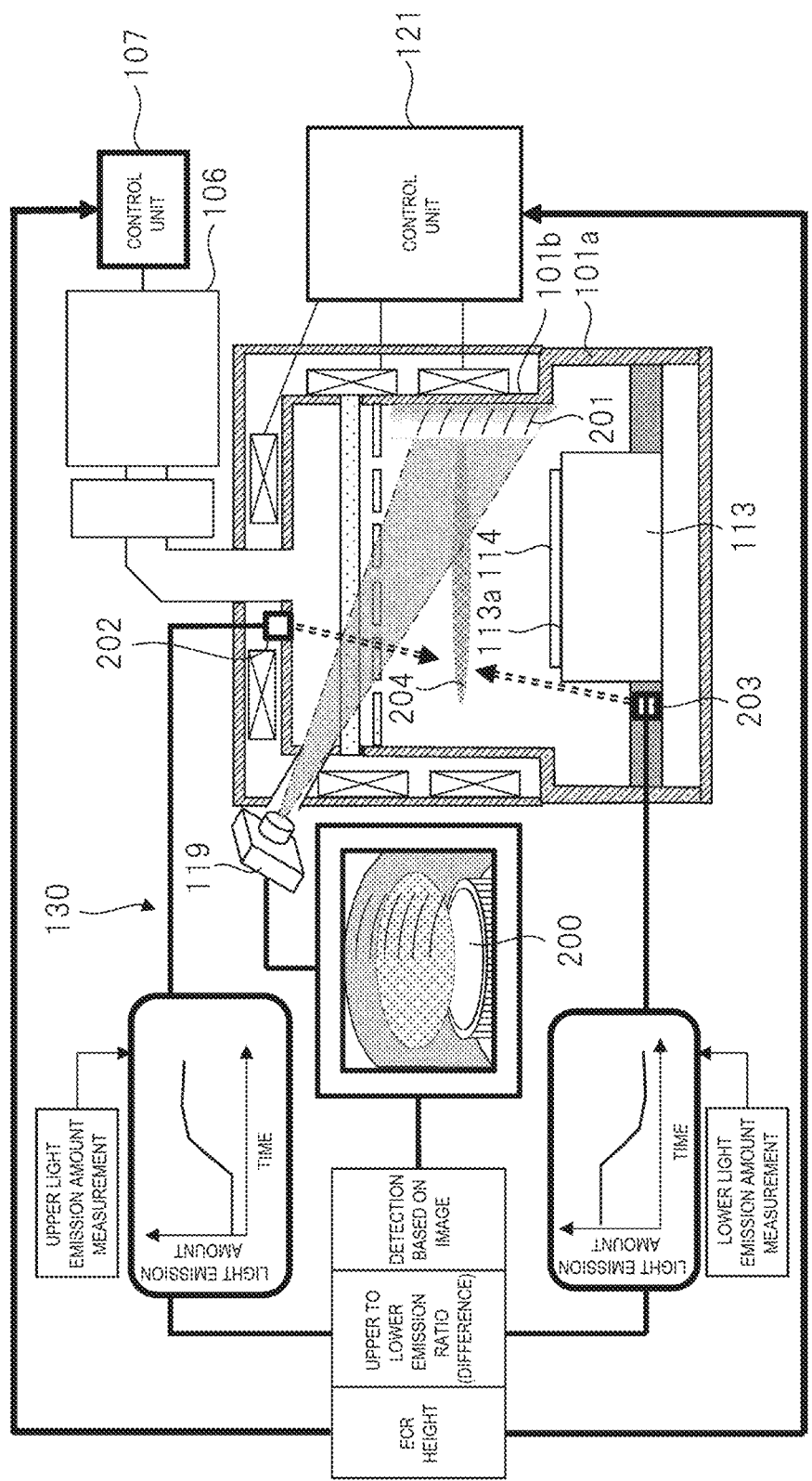
[FIG. 2]

[FIG. 5]

| STEP NUMBER | 1 | ... | i (PREVIOUS STEP) | i+1 (SUBSEQUENT STEP) | ... |
|---|---|---|---|---|---|
| ETCHING PROCESSING TIME (SECOND) | T1 | ... | 5 | 5 | ... |
| STEP INTERRUPT OR CONTINUE | — (INTERRUPT) | ... | INTERRUPT | CONTINUE | ... |
| GAS | SF6 100sccm | ... | GAS Asccm | GAS Asccm | ... |
| PRESSURE (Pa) | P1 | ... | Pi | Pi+2 | ... |
| MICROWAVE POWER (WATT) | M1 | ... | Xi | Xi+1 | ... |
| RF BIAS (WATT) | R1 | ... | Yi | Yi+1 | ... |
| A COIL CURRENT (AMPERE) | A1 | ... | Ai | Ai+1 | ... |
| B COIL CURRENT (AMPERE) | B1 | ... | Bi | Bi+1 | ... |
| C COIL CURRENT (AMPERE) | 5 | ... | Ci | Ci+1 | ... |
| ECR HEIGHT (mm) | 70 | ... | Xi | Xi+1 | ... |

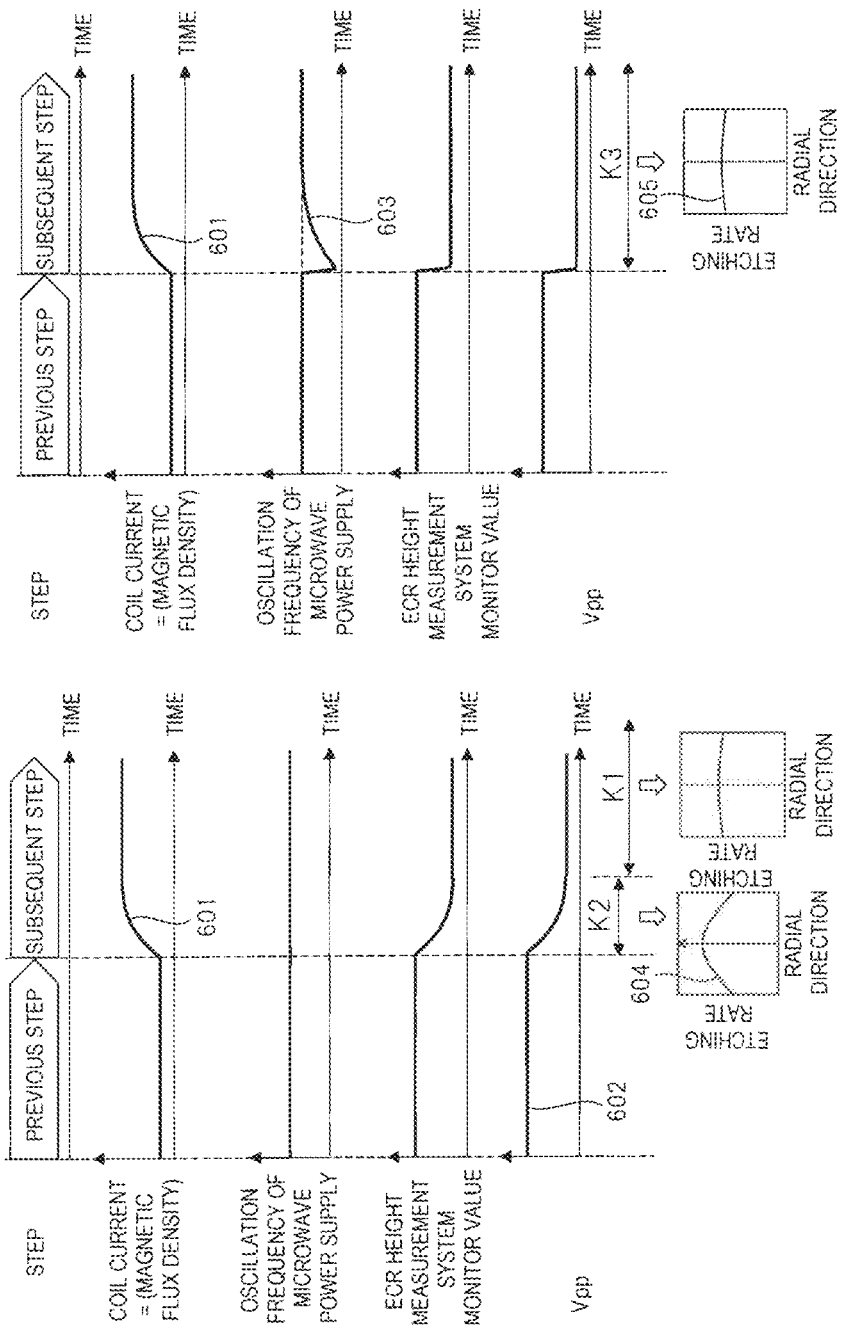

[FIG. 7]

| COIL A CURRENT | COIL B CURRENT | COIL C CURRENT | ECR HEIGHT F:2.40(GHz) B:0.0857(T) | ... | ECR HEIGHT F:2.45(GHz) B:0.0875(T) | ... | ECR HEIGHT F:2.50(GHz) B:0.0892(T) |
|---|---|---|---|---|---|---|---|
| A1 | B1 | C1 | 45mm | ⋮ | 50mm | ⋮ | 55mm |
| A2 | B2 | C2 | 54mm | ⋮ | 60mm | ⋮ | 66mm |
| A3 | B3 | C3 | 63mm | ⋮ | 70mm | ⋮ | 77mm |
| A4 | B4 | C4 | 71mm | ⋮ | 80mm | ⋮ | 88mm |
| A5 | B5 | C5 | 80mm | ⋮ | 90mm | ⋮ | 99mm |
| A6 | B6 | C6 | 89mm | ⋮ | 100mm | ⋮ | 111mm |
| ⋮ | ⋮ | ⋮ | ⋮ | | ⋮ | | ⋮ |
| Ai | Bj | Ck | Xmm | | Ymm | | Zmm |

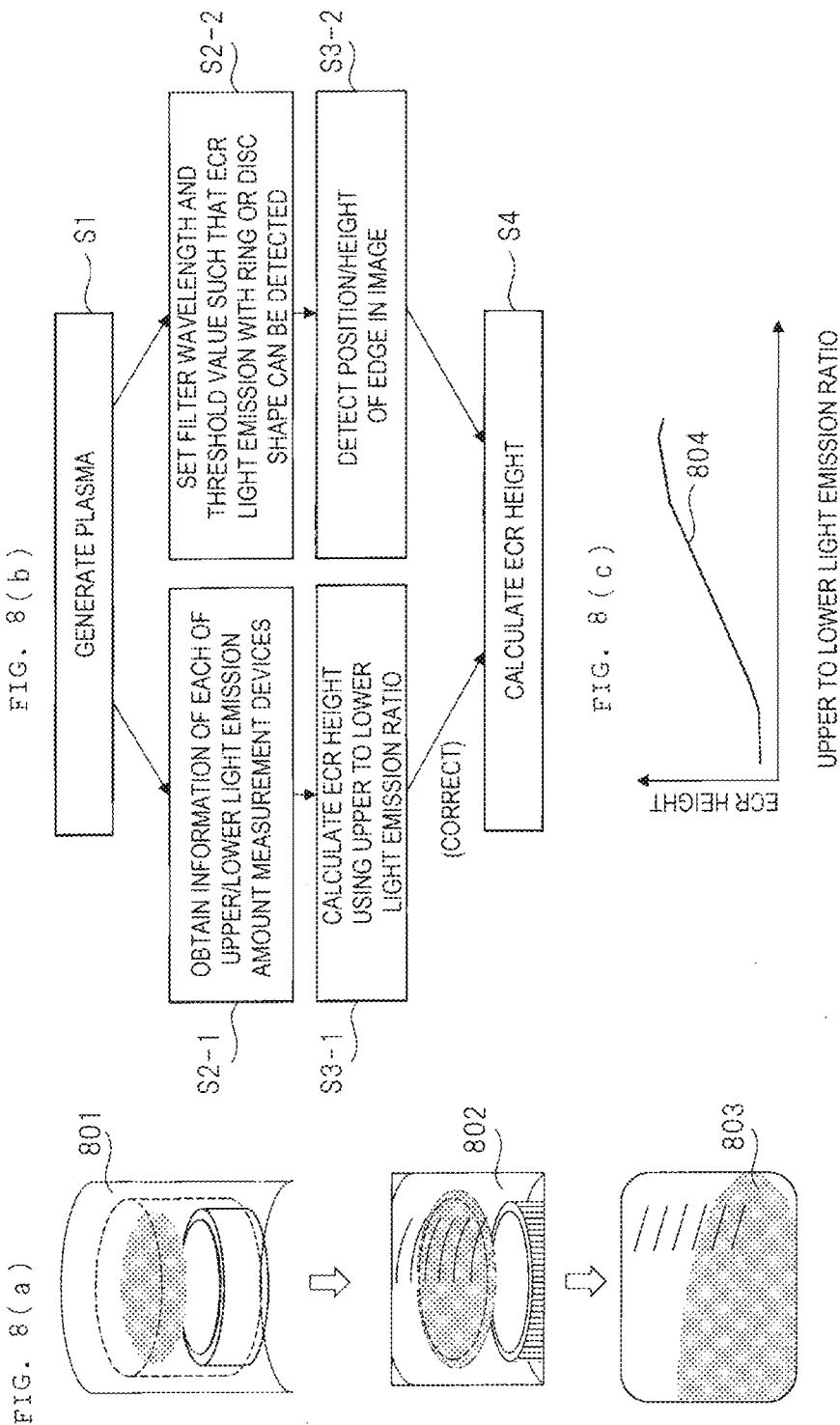

[FIG. 10]

| | COIL CURRENT (AMPERE) | ECR HEIGHT (mm) | OSCILLATION FREQUENCY (GHz) | COIL CURRENT (AMPERE) | ECR HEIGHT (mm) | OSCILLATION FREQUENCY (GHz) |
|---|---|---|---|---|---|---|
| DEVICE 1 | 6 | 60 | 2.4507 | 3 | 70 | 2.4506 |
| DEVICE 2 | 6 | 60 | 2.4501 | 3 | 70 | 2.4503 |
| DEVICE 3 | 6 | 60 | 2.4518 | 3 | 70 | 2.45186 |
| DEVICE 4 | 6 | 60 | 2.4498 | 3 | 70 | 2.4499 |
| DEVICE 5 | 6 | 60 | 2.45 | 3 | 70 | 2.4501 |

PLASMA PROCESSING APPARATUS, PLASMA PROCESSING METHOD, AND ECR HEIGHT MONITOR

TECHNICAL FIELD

The present invention relates to a plasma processing apparatus and a plasma processing method that process a sample such as a semiconductor wafer (hereinafter also simply referred to as a wafer) using plasma formed in a processing chamber, particularly to a plasma processing apparatus and a plasma processing method that process a sample by supplying a magnetic field into a processing chamber and acting the magnetic field on plasma, and an ECR height monitor.

BACKGROUND ART

As the degree of integration of a semiconductor device increases, both controllability over a processing shape and improvement of uniformity in a wafer surface are required. In order to improve the uniformity in the wafer surface, an etching rate is made uniform by making a plasma distribution uniform.

An electron microtron resonance (ECR) type plasma etching device is known in which a microwave electric field and a magnetic field generated by a solenoid coil interact with each other, atoms and molecules of a processing gas are excited to form plasma in a processing chamber, and the plasma is used. In the plasma etching device as described above, PTL 1 discloses a method of changing a position of generated plasma by changing a magnetic field intensity with a plurality of solenoid coils provided on an outer periphery of a plasma processing chamber, and by, during sample processing and over-etching of the sample, changing a parallel spacing distance of a planar-shaped resonance region to a surface to be processed of the sample.

PTL 2 discloses a method of modulating a microwave frequency satisfying an ECR condition in a band of 2.66 GHz to 2.24 GHz, efficiently absorbing microwave energy into an entire plasma generating chamber, and generating uniform plasma with high density.

In order to improve the controllability of the processing shape, PTL 3 discloses a method of performing a plasma etching processing by alternately introducing, for example, an etching gas and a deposition gas that forms a protective film into a processing chamber in a state where the plasma is generated. Further, a method is exemplified in which etching parameters such as a source power, a magnetic field, and a processing temperature are changed step by step in a short time.

In recent years, the number of steps of the etching processing tends to increase from several tens of steps to several hundreds of steps, and each step time is about several seconds, which is shorter than the etching step in the related art. Further, switching between steps is often performed while plasma discharge is continued from a viewpoint of improving throughput and shortening an etching processing time.

CITATION LIST

Patent Literature

PTL 1: JP-A-7-130714
PTL 2: JP-A-6-73568
PTL 3: JP-A-60-50923

SUMMARY OF INVENTION

Technical Problem

When switching the steps while the plasma discharge is continued as described above (hereinafter referred to as a discharge continuation step), a technique for changing only a coil current for forming the magnetic field has the following problems.

When shifting from a previous step to a subsequent step in the above-described discharge continuation step, and when switching a set value of the coil current, the coil current is, actually, switched with a delay due to a transient response time of the coil current. Along with this, the magnetic field formed in the processing chamber is also delayed with the coil current, so that the change to an ECR height set in the subsequent step is delayed by about 1 to 3 seconds due to the step switching.

In this case, if a time of the subsequent step is long enough, there is no problem. However, for example, in the discharge continuation step of about 5 seconds, about half of the time is a transition period, and the etching process proceeds while the plasma fluctuates during this period, resulting in problems that processing uniformity cannot be obtained sufficiently and performance cannot be reproduced.

Further, there are differences in magnetic field profiles formed under the same coil current condition and individual differences in an oscillation frequency of a micro power supply of each device, which are one of the factors of machine difference.

An object of the invention is to provide a technique capable of improving the performance and reproducibility of plasma processing.

The above and other objects and new features of the invention will become apparent based on the description of the specification and the accompanying drawings.

Solution to Problem

In the invention disclosed in the application, an outline of typical content will be briefly described as follows.

A plasma processing apparatus of the invention is a plasma processing apparatus including a processing chamber where a sample is processed using plasma, a radio frequency power supply configured to supply a radio frequency power for generating the plasma, a sample stage on which the sample is placed, and a magnetic field forming mechanism configured to form a magnetic field in the processing chamber. The plasma processing apparatus further includes a control unit configured to, based on image data of the plasma, monitor a height of ECR which is electron cyclotron resonance generated by an interaction between the radio frequency power and the magnetic field, and to control a frequency of the radio frequency power such that the monitored ECR height becomes a predetermined height.

A plasma processing method of the invention includes a step of, based on image data of plasma, monitoring a height of ECR which is electron cyclotron resonance generated by an interaction between a radio frequency power and a magnetic field, and to control a frequency of the radio frequency power such that the monitored ECR height becomes a predetermined height.

In addition, a ECR height monitor of the invention is configured to monitor a height of ECR which is electron cyclotron resonance generated by an interaction between a radio frequency power for generating plasma and a magnetic field. The ECR height monitor is configured to monitor the ECR height by using image data of the plasma and a light emission intensity distribution of the plasma in a height direction of a processing chamber where the plasma is generated.

Advantageous Effect

In the invention disclosed in the application, effects obtained by the typical content will be briefly described as follows.

According to the invention, the ECR height can be controlled at a speed higher than that of a method of controlling the ECR height only by the coil current. In addition, the performance and reproducibility of the plasma processing can be improved in the etching processing or the like with a short step time in the discharge continuation step. Especially when switching to a processing step under a low dissociation plasma condition that is a low microwave power is to be performed, the process performance such as uniformity and shape controllability can be improved, and the reproducibility can also be improved. In addition, there is an effect that a machine difference can be reduced.

BRIEF DESCRIPTION OF DRAWINGS

FIG. 1 is a schematic diagram showing a configuration of a plasma processing apparatus according to an embodiment of the invention.

FIG. 2 is a schematic diagram showing a configuration of an ECR height measurement device of the plasma processing apparatus according to the embodiment of the invention.

FIG. 5 is a diagram showing an etching recipe in the plasma processing apparatus according to the embodiment of the invention.

FIGS. 6(a) and 6(b) are diagrams showing device VPP time data and a wafer rate distribution when a coil current and an oscillation frequency are changed in the plasma processing apparatus according to the embodiment of the invention.

FIG. 7 is a diagram showing a database of the coil current, the oscillation frequency, and the ECR height in the plasma processing apparatus according to the embodiment of the invention.

FIGS. 8 (a) to 8 (c) show diagrams showing a procedure of calculating the ECR height of the plasma processing apparatus according to the embodiment of the invention, in which FIG. 8 (a) is a camera image, FIG. 8 (b) is a calculation flow, and FIG. 8(c) is a diagram showing a relationship between the ECR height and a light emission ratio.

FIG. 10 is a diagram showing ECR height adjustment based on oscillation frequency control in the plasma processing apparatus according to the embodiment of the invention.

DESCRIPTION OF EMBODIMENTS

First Embodiment

Figure 3A:
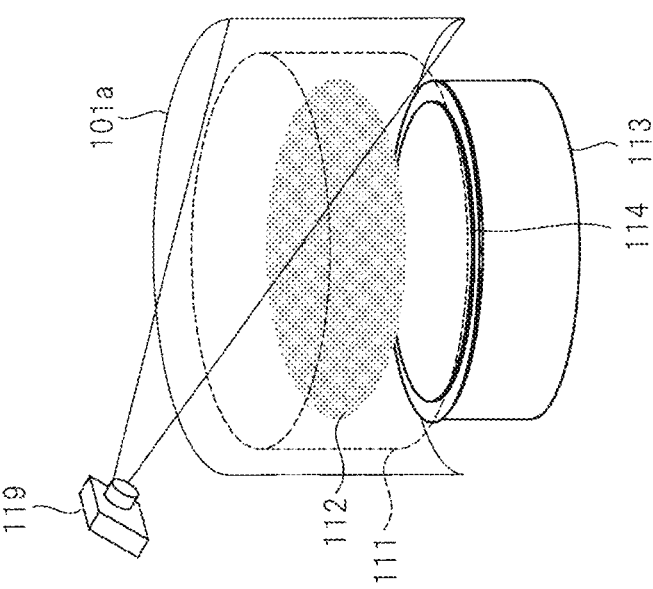
FIGS. 3(a) to 3(c) show diagrams of an imaging state and images of a camera of the ECR height measurement device of the plasma processing apparatus according to the embodiment of the invention, in which FIG. 3 (a) is the imaging state, and FIG. 3 (b) and FIG. 3 (c) are camera images.

A first embodiment of the invention will be described below with reference to the drawings.

FIG. 1 shows a configuration of a plasma processing apparatus according to the embodiment of the invention. The plasma processing apparatus shown in FIG. 1 is a plasma etching device (hereinafter also referred to as a plasma processing apparatus) for generating plasma by microwave electron cyclotron resonance (ECR) and performing a plasma etching processing using the generated plasma.

The plasma processing apparatus of the present embodiment includes a processing chamber (plasma processing chamber) 101 where the plasma processing is performed on a wafer (sample) 114 using plasma 111, a radio frequency power supply 106 configured to supply a radio frequency power for generating the plasma 111, a sample stage 113 disposed in the processing chamber 101 and on which the wafer 114 is placed, and a magnetic field forming unit (magnetic field forming mechanism) configured to form ECR which is electron cyclotron resonance.

An exhaust device 109 configured to perform vacuum exhaust is connected to the processing chamber 101. In addition, a shower plate 102 and a quartz top plate 103 are disposed on an upper portion of the processing chamber 101. The shower plate 102 includes a plurality of holes. A plasma etching processing gas to be supplied from a gas supply mechanism 108 is introduced into the processing chamber 101 through the plurality of holes of the shower plate 102.

The quartz top plate 103 is disposed above the shower plate 102, and a gas supply gap is provided between the shower plate 102 and the quartz top plate 103. The quartz top plate 103 transmits an electromagnetic wave from above and seals the upper portion of the processing chamber 101 into an airtight state. A dielectric is used as a material of the shower plate 102 and the quartz top plate 103, but it is preferable to use quartz such that plasma light emission in the processing chamber 101 can be easily seen.

A cavity resonator 104 is formed on the quartz top plate 103. An upper portion of the cavity resonator 104 is open, and a waveguide 105 including a vertical waveguide extending in a vertical direction and a waveguide converter also serving as a corner for bending a direction of the electromagnetic wave by 90 degrees is connected thereto. The waveguide 105 is an oscillation waveguide that propagates the electromagnetic wave, and the radio frequency power supply 106 for generating the plasma is connected to an end of the waveguide 105.

The radio frequency power supply 106 is a power supply for generating a plasma generating electromagnetic wave, and generates the electromagnetic wave based on control from a control unit 107. A microwave power supply is used, which is capable of oscillating a microwave in a range of 2.4 GHz to 2.5 GHz with a center frequency of 2.45 GHz, as an oscillation frequency of the radio frequency power to be supplied from the radio frequency power supply 106.

The microwave power supply of the present embodiment may, in a narrow band, change the oscillation frequency while oscillating the radio frequency power in accordance with a control signal of a frequency in the control unit 107. That is, the frequency of the radio frequency power to be supplied from the radio frequency power supply 106 can be changed by a mechanism including the control unit 107.

The radio frequency power supply 106 is preferably a solid state power supply, for example, having a characteristic of high power controllability and high responsiveness of a pulse and an output even in a low power region of several tens of watts output, which is 2 percent of a maximum power of 1600 watts of the radio frequency power supply 106. In the present embodiment, the radio frequency power supply 106 is not a magnetron power supply but a solid state microwave (also referred to as a solid microwave) power supply.

A microwave generated from the radio frequency power supply 106 propagates through the waveguide 105, and propagates into the processing chamber 101 via the cavity resonator 104, the quartz top plate 103, and the shower plate 102. A magnetic field forming coil (magnetic field forming unit, magnetic field forming mechanism) 110 is disposed on an outer periphery of the processing chamber 101. The magnetic field forming coil 110 includes a plurality of coils such as an upper coil 110a, a middle coil 110b, and a lower coil 110c, and forms a magnetic field in the processing chamber 101. The power oscillated from the radio frequency power supply 106 for generating the plasma generates the plasma 111 with high density in the processing chamber 101 by the interaction between the magnetic field formed by the magnetic field forming coil 110 and the ECR.

In the plasma 111, a plane (hereinafter referred to as an ECR plane 112) having a magnetic flux density that satisfies a condition of the electron cyclotron resonance (ECR) with respect to the microwave oscillation frequency is formed. Since plasma generation is mainly performed on the ECR plane 112, a height position of the ECR plane 112 is important in plasma distribution control.

The plasma processing apparatus of the present embodiment includes the control unit 107 and a control unit 121 configured to, based on image data of the plasma 111, monitor the height of the ECR which is the electron cyclotron resonance generated by the interaction between the radio frequency power supplied from the radio frequency power supply 106 and the magnetic field, and to control the frequency of the radio frequency power such that the monitored ECR height becomes a predetermined height.

The magnetic field forming mechanism includes the coils for forming the magnetic field, and the control unit 107 and the control unit 121 control the frequency of the radio frequency power so as to correct a variation of the ECR height, due to a response delay of a current flowing through each coil, for a predetermined value.

The sample stage 113 is disposed on a lower portion of the processing chamber 101 so as to face the quartz top plate 103. The sample stage 113 includes a placing surface 113a for placing and holding the wafer 114 as a substrate to be processed. In addition, central axes of positions of an exit from the waveguide 105 to the cavity resonator 104, the processing chamber 101, the sample stage 113, and the wafer 114 are the same.

The sample stage 113 is made of aluminum or titanium as a material. A dielectric film 115 is formed on an upper surface (placing surface 113a) which is apart of the sample stage 113. On an upper surface of the dielectric film 115 of the sample stage 113, a sprayed film made of alumina ceramics or the like is disposed.

The dielectric film 115 includes conductor films (electrostatic adsorption films) 116 for electrostatically adsorbing the wafer 114 therein, and the wafer 114 is electrostatically adsorbed by applying a direct current voltage (not shown). Further, a radio frequency RF bias is applied to the sample stage 113 from an RF bias power supply 117.

The RF bias power supply 117 is matched by a matching circuit 118. In order to monitor a VPP (V peak-to-peak) of the radio frequency RF bias voltage applied to the sample stage 113 from the RF bias power supply 117, a VPP monitor (voltage monitor) 120 is provided on an RF bias power feed line.

In addition, in order to monitor a position of a height (hereinafter referred to as ECR height) of strong light emission with a disc or a ring shape on the ECR plane 112 of the plasma 111, the plasma processing apparatus of the present embodiment is provided with an ECR height monitor as defined below. That is, the ECR height monitor monitors the ECR height by using the image data of the plasma 111 and a light emission intensity distribution of the plasma 111 in a height direction of the processing chamber 101 where the plasma 111 is generated.

As an example of the ECR height monitor, as shown in FIGS. 1 and 2, a camera 119 for ECR height measurement is attached at a position where the light emission of the plasma 111 generated above the sample stage 113 in the processing chamber 101 can be viewed from an obliquely upward direction. That is, the camera 119 can image the light emission of the plasma 111 generated above the sample stage 113 from a horizontal direction with respect to the mounting surface 113a or an oblique direction where an acute angle is formed with the horizontal direction. The camera 119 is attached with an optical fiber, a state of light emission 204 shown in FIG. 2 in the processing chamber 101 can be seem via a tip of the optical fiber through the quartz top plate 103 and the quartz shower plate 102 which are transparent members. During the plasma processing, a region where the ECR plane 112 is formed, an edge position of the region, and a side wall 101b in a chamber 101a shown in FIG. 2 can be photographed by the camera 119 in a field of view (image (image data) 200).

Figure 3B:
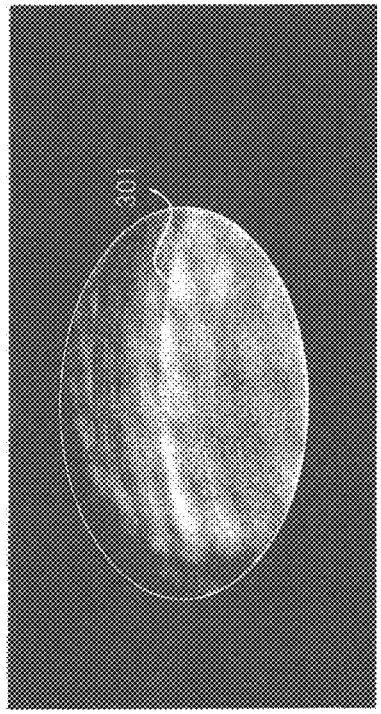
Figure 3C:
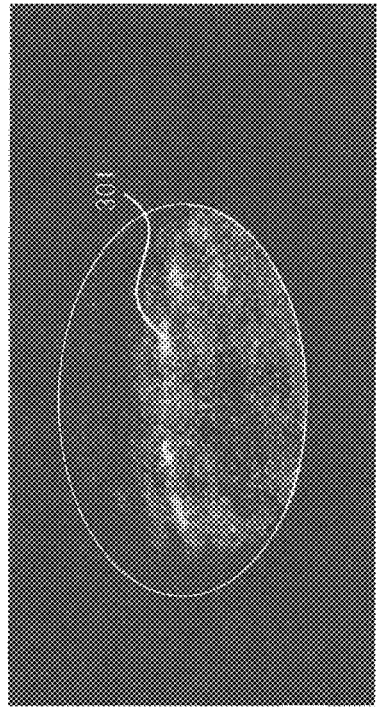

Further, the camera 119 includes a light amount diaphragm and a high-speed shutter, and a wavelength filter with the function capable of filtering an arbitrary wavelength region. Accordingly, as shown in FIG. 2 and FIG. 3 (a), from the entire light emission in the chamber 101a in the plasma 111, the strong light emission 204 with a disc or ring shape caused by microwave absorption with the ECR or a plasma generation region can be distinguished. As examples of camera images shown in FIGS. 3(b) and 3(c), an edge 301 of the ECR light emission can be detected by adjusting the diaphragm and the wavelength filter. That is, it is difficult to detect the edge 301 of the ECR light emission in the camera image in FIG. 3(b), whereas the edge 301 of the ECR light emission can be detected according to a camera image after adjusting a shutter speed shown in FIG. 3 (c).

In addition, as shown in FIG. 2, a scale 201 may be attached to the side wall 101b in the processing chamber 101 such that the position of the strong light emission 204 of the ECR plane 112 in FIG. 3 can be detected. Although the purpose of the scale 201 is to more accurately measure a position of the edge (see FIG. 3) 301 of the strong light emission 204 of the ECR from an image 200 and make the ECR height and the position known, the scale 201 can be omitted if it is not particularly necessary for fixation or image processing capability of the camera 119.

Regarding a radial direction of the position of the edge 301 of the light emission 204 on the ECR plane 112, a radius slightly changes depending on the microwave power, a magnetic field profile, or a processing pressure. Regarding the height, since the strong light emission region with a ring shape has a thickness, it is difficult to accurately determine the ECR height based on only the camera image of the plasma light emission. However, since a main purpose of the ECR height detection performed with the camera 119 is to measure the variation and change amount of the ECR height, there is no problem.

For more accurate ECR height detection, a plurality of cameras 119 may be disposed and the position of the ECR height may be calculated based on the plurality of cameras 119, but it is difficult to control the calculation. In the present embodiment, in order to correct the position of the ECR height obtained with the camera 119, a light emission amount measurement device 130 for measuring a light emission amount in the chamber 101a is provided as shown in FIG. 2.

Specifically, the plasma processing apparatus of the present embodiment includes a monitor mechanism configured to monitor the ECR height. The monitor mechanism includes the camera 119 configured to image the plasma 111 from the horizontal direction or the oblique direction, a first spectrometer configured to obtain the light emission intensity of the plasma 111 from above the ECR plane 112, and a second spectrometer configured to obtain the light emission intensity of the plasma 111 from below the ECR plane 112.

The light emission amount measurement device 130 includes two spectrometers capable of measuring the light emission amount of the plasma 111 from above and below the ECR plane 112 via the optical fiber, that is, an upper light emission amount measurement device (first spectrometer) 202 and a lower light emission amount measurement device (second spectrometer) 203 which are measurement mechanisms configured to measure the ECR height, are provided. A sampling time of the light emission amount is approximately 10 milliseconds to 100 milliseconds, and a wavelength up to about 200 nanometers to 800 nanometers can be obtained. Although a measurement direction is not particularly defined, it is desirable to be able to measure the light emission 204 located at the same radius position in a plane of the wafer 114 from both above and below. As a method of obtaining a value of the ECR height using the light emission amount measurement device 130, first, the image 200 shown in FIG. 2 or an image 801 which is image data shown in FIG. 8 photographed by the camera 119 is processed, and the ECR height is derived from an image 802 and an image 803 roughly (specifically, on an order of 3 mm). At this time, an upper light emission amount measurement and a lower light emission amount measurement are respectively performed using the upper light emission amount measurement device 202 and the lower light emission amount measurement device 203 which are two spectrometers capable of measuring the light emission amount via the optical fiber from above and below, and from an obtained measurement value, a detection based on the image or an upper to lower emission ratio (difference) is obtained to derive the ECR height. That is, the plasma processing apparatus of the present embodiment controls, by the control unit 107, the frequency of the radio frequency power to be supplied from the radio frequency power supply 106 such that the measurement value of the ECR height obtained by the measurement mechanism becomes the predetermined value. Further, as the ECR height, the height of the ECR plane 112 is calculated based on an emission image of the plasma 111 in the processing chamber 101 and the light emission intensity distribution in the height direction in the processing chamber 101.

Specifically, as shown in FIG. 8(b), first, the plasma generation in step S1 is performed. Further, information of each of the upper/lower light emission amount measurement devices shown in step S2-1 is obtained. Herein, the height of the ECR which is the electron cyclotron resonance generated by the interaction between the radio frequency power for generating the plasma 111 and the magnetic field is monitored based on the image data of the plasma 111. First, upper and lower light emission amounts are measured with the upper light emission amount measurement device 202 and the lower light emission amount measurement device 203 shown in FIG. 2. Next, the ECR height is calculated by determining the upper to lower emission ratio shown in step S3-1. At this time, the ECR height determined based on the emission ratio is corrected, and finally the ECR height is calculated (step S4). That is, the ECR height with an accuracy of 1 mm can be derived from a relational curve 804 indicating the ratio of the light emission amount shown in FIG. 8(c). In the light emission amount measurement device 130 shown in FIG. 2, the ECR height is determined based on the upper to lower emission ratio (difference) obtained based on the measurement value measured by the upper light emission amount measurement device 202 and the lower light emission amount measurement device 203. Further, in accordance with the measurement value of the ECR height, feedback is applied to the control unit 107, and the oscillation frequency is adjusted by the control unit 107. Similarly, in accordance with the measurement value of the ECR height, the feedback is applied to the control unit 121 shown in FIG. 2, and the coil current is adjusted by the control unit 121. For example, a correlation between the coil current in the magnetic field and the ECR height is created in advance, and the ECR height is measured. When the measurement value of the ECR height at this time is different from the ECR height of the correlation created in advance, the coil current is changed, and the frequency of the radio frequency power to be supplied from the radio frequency power supply 106 is finely adjusted to match the ECR height obtained by the measurement with the ECR height in the correlation. That is, the frequency of the radio frequency power is controlled such that the monitored ECR height becomes the predetermined height.

The control unit 107 and the control unit 121 determine the ECR height by using the image data of the plasma 111 and the light emission intensity distribution of the plasma 111 in the height direction of the processing chamber 101.

As shown in step S2-2 of FIG. 8(b), a filter wavelength and a threshold value may be set such that the light emission 204 with a ring or disc shape of the ECR can be detected. Further, as shown in step S3-2, the position/height of the edge 301 may be detected in the image, and the ECR height may be calculated (step S4).

Figure 4A:
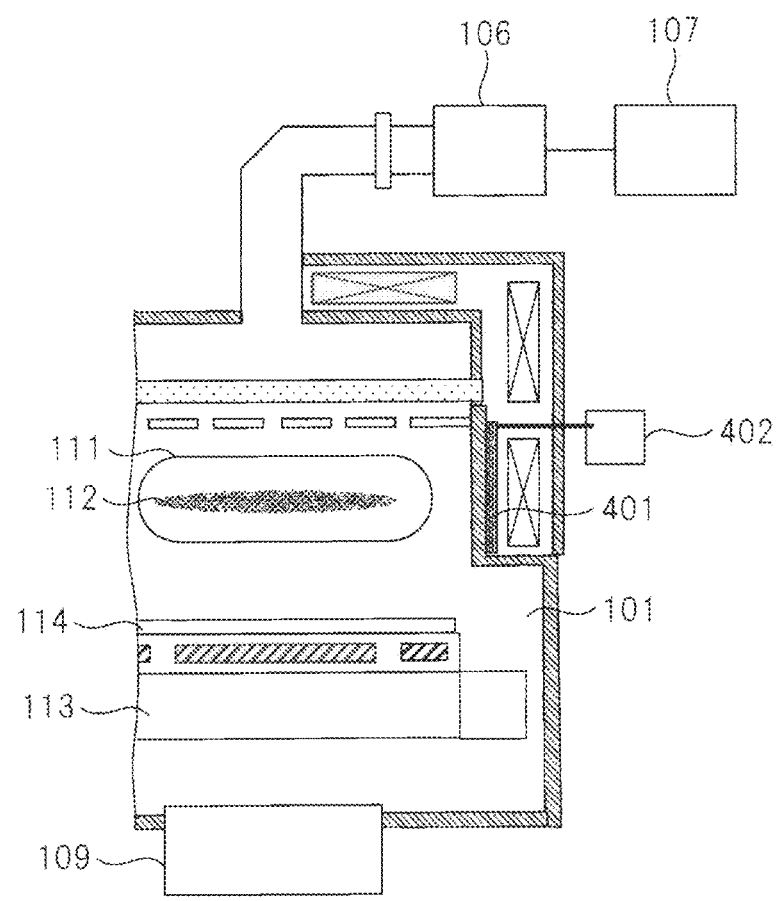
FIGS. 4 (a) and 4 (b) show diagrams of another measurement method of the ECR height measurement device of the plasma processing apparatus according to the embodiment of the invention, in which FIG. 4 (a) is a schematic diagram showing a part of the plasma processing apparatus.
FIG. 4(b) is a diagram showing another measurement state.
Figure 4B:
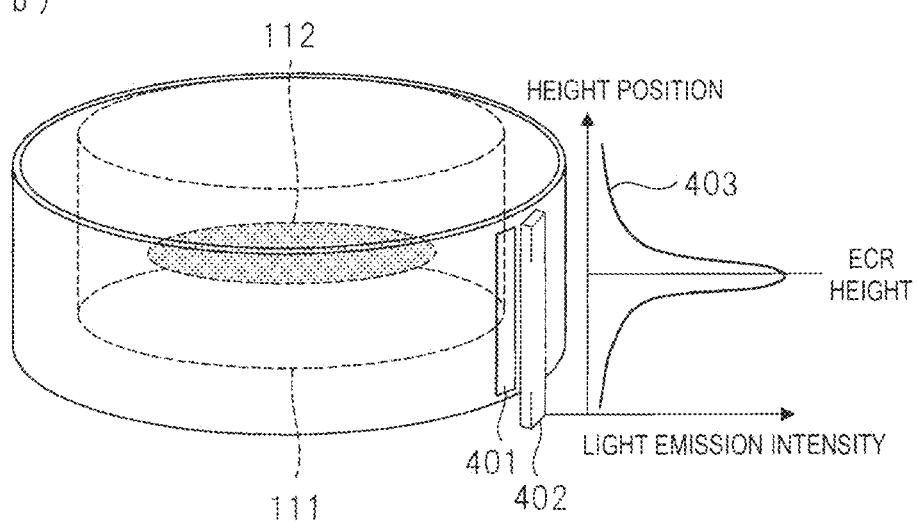

In addition, as another method other than the above method for monitoring the ECR height, as shown in FIG. 4(a), a mechanism is used in which a slit 401, which is vertically long and can transmit only the emission of the plasma 111, is provided in a part of the inside of the cylindrical processing chamber 101 and a light receiving element 402 capable of measuring the light emission intensity distribution in the vertical direction is provided. By using the above mechanism, as shown in FIG. 4(b), the ECR height can be roughly determined by regarding a curve 403 representing a portion with the highest light emission intensity in the vertical direction as the ECR height.

However, in a high microwave power mode region, a region where an applied microwave power is absorbed on a plasma side is not an ECR plane main body. As a result, since planar shape strong plasma emission on the ECR plane 112 may spread in the vertical direction, a light emission intensity peak expands or becomes two. There is a possibility that the ECR height that is the light emission intensity peak cannot be obtained correctly.

Since it is difficult to determine the ECR height only with this method, it is desirable to correct the ECR height value from the upper light emission amount measurement device (first spectrometer) 202 and the lower light emission amount measurement device (second spectrometer) 203, that is, two spectrometers capable of measuring the light emission amount from above and below the ECR via the optical fiber.

Next, the plasma processing in the plasma processing apparatus of the present embodiment will be described.

As shown in FIG. 1, the wafer 114 is transferred into the processing chamber 101 and is placed on the dielectric film 115 of the sample stage 113. Then, the placed wafer 114 is electrostatically adsorbed and held at a predetermined position on the sample stage 113 by electrostatic force generated by a direct current voltage applied by a direct current power supply. Thereafter, the plasma etching processing gas is supplied from the gas supply mechanism 108 to the processing chamber 101 in a vacuum state with a reduced pressure through a mass flow controller (not shown).

Then, the gas passes through a gap between the quartz top plate 103 and the shower plate 102 and is introduced into the processing chamber 101 through the plurality of holes in the shower plate 102. While controlling the exhaust device 109 for vacuum, the inside of the processing chamber 101 is controlled to a predetermined pressure. Thereafter, the electromagnetic wave is oscillated from the radio frequency power supply 106 for generating the plasma, and the plasma 111 is generated in the processing chamber 101 by the interaction between the electromagnetic wave transferred into the processing chamber 101 and the magnetic field formed by a plurality (three in the present embodiment) of magnetic field forming coils 110.

The radio frequency power supply 106 can receive the control signal of the oscillation frequency from the control unit 107 to change the oscillation frequency. Based on a case where the oscillation frequency is changed (Equation 1), the ECR height can be changed.

$$fc = q \times B / 2\pi m \text{ (}fc\text{: resonance frequency, }B\text{: magnetic flux density, }q\text{: electric charge, }m\text{: mass)} \quad \text{(Equation 1)}$$

In the present embodiment, simultaneously with plasma ignition, a radio frequency voltage is applied from the RF bias power supply 117 to the sample stage 113 in the processing chamber 101 under the control of the control unit 107. Due to the radio frequency voltage from the RF bias power supply 117, an action of drawing ions from the plasma 111 to the wafer 114 occurs. Accordingly, the plasma etching processing is performed on the wafer 114. At this time, a reaction product generated by the gas or the etching is exhausted through the exhaust device 109 provided below the processing chamber 101.

Next, along with an etching recipe that is a recipe (processing condition) for the etching processing shown in FIG. 5, in a situation where discharge continues from a previous step that is a step before a switching to a subsequent step that is a step after the switching, a light emission amount, a VPP, and a section etching rate when switching the recipe in a processing step (hereinafter, simply referred to as a step) will be described. Herein, the light emission amount, the VPP, and the section etching rate when the ECR height is changed only by the coil current and when the ECR height is changed at a high speed by simultaneously changing the coil current and the oscillation frequency of the radio frequency will be described with reference to FIG. 6(*a*).

According to the etching recipe (processing condition) shown in FIG. 5, for example, in the previous step of the switching, the oscillation frequency of the microwave power supply is 2.45 GHz as the center frequency, oscillation occurs in a power amount of Xi watts and an RF bias is set to Yi watts. Then, currents of the upper coil (A coil in FIG. 5) 110a, the middle coil (B coil in FIG. 5) 110b, and the lower coil (C coil in FIG. 5) 110c are in a state of being applied as set values in Ai, Bi, and Ci (amperes), respectively. Under this state, for a monitor VPP at this time, Zi (V) and a light emission amount including the plasma emission at a certain wavelength are measured, and for the ECR height, the etching processing is performed with stable plasma at Xi (millimeters) above the wafer 114.

Next, according to a setting of the etching recipe (processing condition) of the subsequent step in the step switching, the power amount (watts) of the microwave is switched to Xi+1, the RF bias (watts) is switched to Yi+1, and the currents (amperes) of the A coil, B coil, and C coil are switched to Ai+1, Bi+1, and Ci+1, respectively. The power amount (watts) of the microwave is Xi+1, and the RF bias (watts) is Yi+1, so that immediately after the change, a change in the power amount is completed in several milliseconds to several tens of milliseconds.

On the other hand, since the coil current is influenced by a generated high self-induction voltage proportional to a rate of change of the current value, a coil current amount (amperes) does not immediately change from Ai to Ai+1. The change in the coil current value is completed with a delay under an influence of a response time constant determined based on a rated power, a self-induction or a mutual induction voltage of the coil current of curves 601 in FIGS. 6(*a*) and 6(*b*). The change in the coil current is completed with a delay of about 1 to 3 seconds to change the current value of approximately (amperes).

This means that it takes the same time to change the magnetic field formed by the coil current, and as a result, it takes about 1 to 3 seconds to change the ECR height from the ECR height Xi (millimeters) shown in FIG. 5 to the ECR height Xi+1 (millimeters) shown in FIG. 5 and set after the step switching.

In addition, for a behavior of the VPP monitor of the RF bias between steps, as shown by a VPP curve 602 in FIG. 6(*a*), during the step switching, first, the change of the RF bias power is completed within several milliseconds to several tens of milliseconds by changing the set RF bias. However, under the influence of the delay in the change of the ECR height and the delay in the change of the plasma 111, the VPP fluctuates with a delay of about 1 to 3 seconds and finally reaches the set VPP.

Also for the plasma light emission intensity, the light emission amount changes immediately after the power of the set microwave is changed. Next, under the influence of the variation of the ECR height, the light emission amount changes with a delay of about 1 to 3 seconds, similarly to the behavior of the VPP.

For the image from the camera 119 of the light emission amount measurement device 130 (ECR height measurement device) shown in FIG. 2, the shutter speed or the diaphragm needs to be changed according to the total plasma light emission amount immediately after the step switching. However, it can be seen that there is no significant change in the image capturing the ECR plane 112, and that as the ECR height changes, a strong light emission amount region with a disc or ring shape on the ECR plane 112 rises or falls slowly after a delay.

Similarly, in the upper light emission amount measurement device 202 or the lower light emission amount measurement device 203, the light emission amount greatly changes due to the change in the microwave power immediately after the step switching. However, when the change of the microwave power is completed, the ratio or difference between the upper and lower light emission intensities (the light emission intensity ratio in the present embodiment) does not change greatly, and basically the height of the ECR plane is high. That is, as a strong light emission body is located above, the light emission intensity ratio for the upper side to the lower side is larger, so that the ECR height can be measured.

In addition, in a method of controlling the ECR height by only the coil current control, the etching rate is as shown in a section etching rate K1 in FIG. 6(a), and the etching is performed for about 1 second in a state where only the microwave power and the RF bias power supply are changed while maintaining the ECR height, which is the condition of the coil current in the previous step. Therefore, in a state of the transient step, the etching rate becomes a convex curve 604 (curve 604 of the etching rate corresponding to a transition section etching rate K2 in FIG. 6 (a)).

There are three coils in the present embodiment. However, since the degree of influence of the mutual induction voltage changes depending on a difference between the coil currents before and after the step, a response speed that is a delay for each combination of the three coil currents also changes. In this way, in the step switching in which all the three coil conditions are changed, the change of the ECR height is further delayed or a problem occurs in the reproducibility.

Next, FIG. 6(b) shows a method of simultaneously changing and controlling the coil current and the microwave oscillation frequency during the step switching in the state where the discharge is continued from the previous step to the subsequent step.

When trying to control the ECR height to a height in the next step at the high speed, as shown in FIG. 7, it is desirable to construct in advance a database corresponding to a correspondence table of the ECR height for each value of the currents of the plurality of coils A to C. Accordingly, as shown in FIG. 5, Xi and Xi+1, which are the ECR heights in the previous step and the subsequent step, are derived in advance. There is an advantage that it is clear how much the microwave oscillation frequency is corrected with respect to the response delay of the coil current, and the microwave oscillation frequency can be easily controlled. In the plasma processing apparatus of the present embodiment, when switching to a processing step in which the plasma processing condition is configured, the current flowing through the coil is set to the controlled current value before switching to the processing step.

As shown in FIG. 7, when the database of the coil currents and ECR heights at microwave oscillation frequencies of, for example, 2.40 GHz, 2.45 GHz, and 2.50 GHz is obtained, it is desirable to use a form for instantly deriving the ECR height from the coil current combination at a certain time in the transient period, then controlling the microwave oscillation frequency and repeating the control until a target ECR height is reached. Accordingly, even in the step switching involving the change in the plurality of coil currents, the ECR height can be accurately and quickly changed to the ECR height of the subsequent step without causing over-control.

As control after reaching the ECR height set in the subsequent step, as shown in a curve 603 of the microwave power supply in FIG. 6(b), even when the ECR height is reached, the control is continued such that the microwave oscillation frequency keeps the ECR height until the current change is completed with a delay of the coil current, and finally the control is performed to return to the oscillation frequency (or center frequency of 2.45 GHz) before the step switching. Also in the present embodiment, from a viewpoint of stable device operation, it is desirable to use 2.45 GHz except for the transient state of the step switching.

The VPP monitor value and the ECR height monitor value also reach predetermined values within 0.1 second after switching to the subsequent step and become stable, and since there is no etching rate during the transition, a good etching rate distribution (etching rate curve 605 corresponding to a section etching rate K3 in FIG. 6(b)) can be achieved.

When the change in the ECR height between continuing steps is sufficient only by the change of the microwave oscillation frequency, there is no problem even if a method of changing only the oscillation frequency without changing the coil current is used. In this case, the ECR height can be controlled in a few milliseconds similar to the change time of the microwave power.

In the plasma processing apparatus of the present embodiment, a control amount of the ECR height can be controlled in a range of about 50 mm to 150 mm with reference to an upper surface of the wafer 114 substantially placed on a placing electrode. When the center frequency of the microwave power supply is 2.45 GHz, depending on the condition of the magnetic field, it is practical to change the oscillation frequency in the range of 2.4 GHz to 2.5 GHz from a viewpoint of an industry science medical (ISM) frequency band, and a control range of the ECR height in this range can be controlled only about 10 mm at most under a magnetic field condition in the related art.

In addition, a method of increasing the range of the oscillation frequency of the radio frequency power from 2 GHz to 3 GHz is also conceivable. However, a frequency originally assumed in the waveguide 105 or the cavity resonator 104 is about 2.45 GHz, and when the frequency is greatly changed from 2.45 GHz, the power to be transferred to the plasma 111 or the oscillation power of the microwave changes, so the range of the oscillation frequency needs to be limited.

A method of controlling the ECR height in this case will be described in a second embodiment to be described later.

Examples of a method of measuring the ECR height in the related art include a method of calculating the ECR height from a database obtained after sufficient magnetic field measurement, or a method of analyzing from the coil current of the device processing data after the etching processing, from the intensity of the plasma light emission, or from the VPP data of the RF bias. However, neither of these methods is an indirect method and is not a method of directly measuring the ECR height in real time during the etching processing. That is, in order to control the ECR height at a high speed, a mechanism capable of measuring the ECR height in real time is needed.

By feeding back the ECR height value and simultaneously changing the coil current and the microwave oscillation frequency, it is possible to perform the control such that the ECR height becomes the predetermined value in a short time.

That is, in the plasma processing apparatus of the present embodiment, the ECR height can be controlled at a speed higher than that of the method of controlling the ECR height only by the coil current. In addition, the performance and reproducibility of the plasma processing can be improved in the etching processing with a short step time in the discharge continuation step. Especially when switching to the processing step under a low dissociation plasma condition that is a low microwave power, the process performance of uniformity and shape controllability can be improved, and the reproducibility can also be improved. In addition, a machine difference can be reduced.

Second Embodiment

Figure 9A:
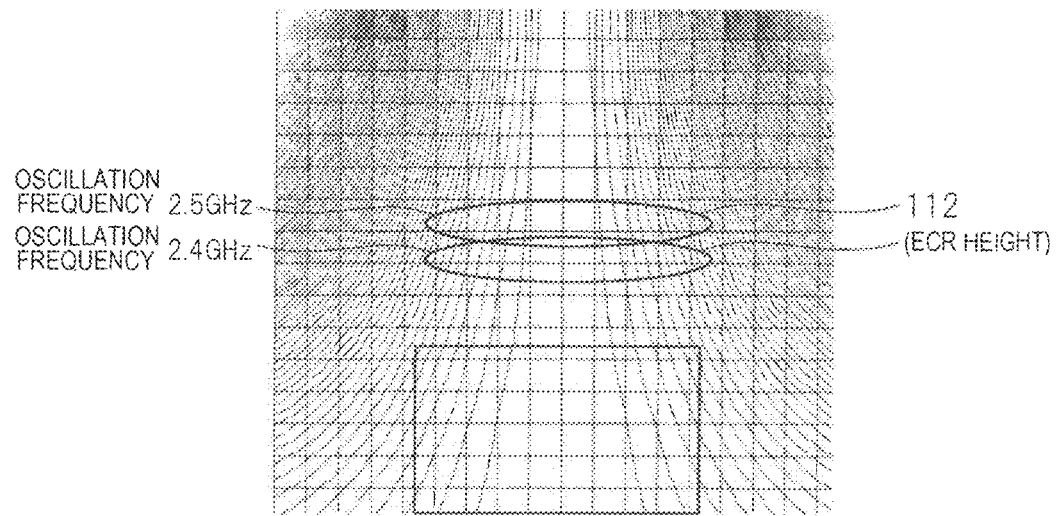
FIGS. 9(a) and 9(b) show diagrams showing a control range of the ECR height when a microwave oscillation frequency is changed to a certain amount in the plasma processing apparatus according to the embodiment of the invention, in which (a) is a diagram when height controllability is low, and (b) is a diagram when height controllability is high.
Figure 9B:
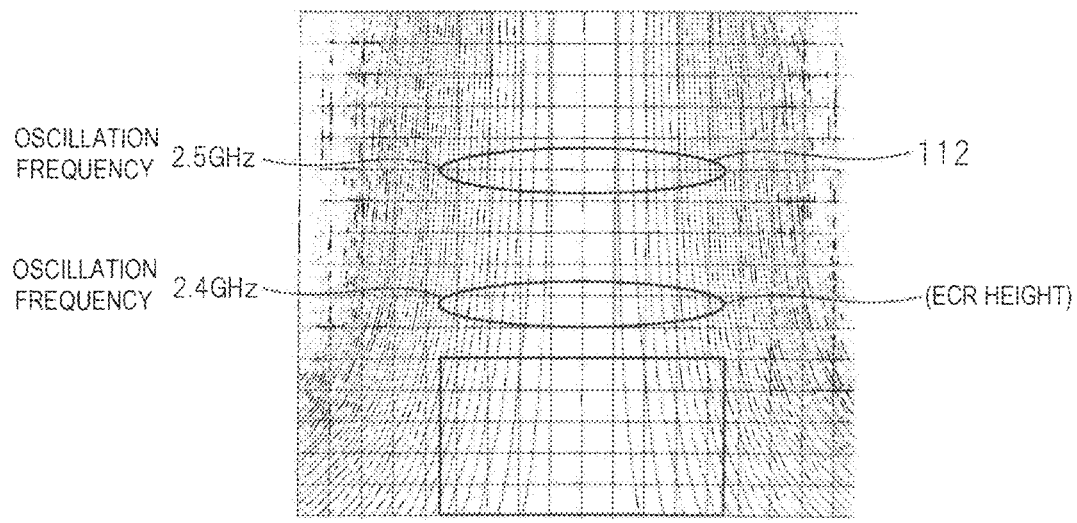

For a method of increasing a variation amount of the ECR height in a limited range of the microwave oscillation frequency from 2.4 GHz to 2.5 GHz, as shown in FIGS. 9(a) and 9(b), the ECR height needs to be the same, and a magnetic field gradient needs to be set to a gentle state. Generally, the higher the position is, the higher the magnetic flux density is, and the lower the position is, the lower the magnetic flux density is. However, the degree thereof needs to be set to a gentle state. FIG. 9(a) shows a case where the height controllability is low in the ECR height control, and FIG. 9(b) shows a case where the height controllability is high in the ECR height control.

In this way, an equation of ECR resonance when a difference ΔB in the magnetic flux density for the ECR height is reduced and a microwave oscillation frequency f is changed to a quantification (Δf) is expressed as follows.

$$f \pm \Delta f = q(B \pm \Delta B)/2\pi m \text{ } (fc: \text{ resonance frequency, } B: \text{ magnetic flux density, } q: \text{ electric charge, } m: \text{ mass)} \quad \text{(Equation 2)}$$

In the present embodiment, an ECR height region satisfying the above (Equation 2) is set to be wide. In this case, it is necessary to change a magnetic field profile, that is, each current of the coil A, the coil B, and the coil C in advance immediately before the switching from the previous step.

In the present embodiment, in a case where currents (amperes) of a coil 1 (upper coil 110a), coil 2 (middle coil 110b), and coil 3 (lower coil 110c) are set to be 27 A, 26 A, and 4 A, respectively, the ECR height is 150 mm when the microwave oscillation frequency is 2.45 GHz, and the ECR height is 156 mm when the microwave oscillation frequency is 2.5 GHz.

However, when the magnetic field profile (magnetic field condition) is changed and the currents of the coil 1, the coil 2, and the coil 3 are set to be 17 A, 18 A, and 12 A, respectively, the ECR height is 150 mm when the microwave oscillation frequency is 2.45 GHz, and the ECR height is 185 mm when the microwave oscillation frequency is 2.5 GHz.

That is, when the oscillation frequency of the radio frequency power supplied from the radio frequency power supply 106 is changed to a predetermined amount, it is preferable to control a value of a current flowing through the coil for forming the magnetic field such that the ECR height is equal to or larger than the predetermined height.

As shown in this example, a correspondence varies depending on a range in which the ECR height is changed. However, when the ECR height needs to be changed to the same amount as a height of the chamber 101a, the above method is essential.

Third Embodiment

Next, a method of adjusting the microwave oscillation frequency with a measure against a machine difference in etching devices will be described with reference to FIG. 10.

When there is an ECR height monitor, a gas type, a pressure condition, a coil current and a microwave power are fixed and discharge etching is performed, and a monitor value of the ECR height and the microwave oscillation frequency at this time are recorded. For example, in each of devices 1 to 5 shown in FIG. 10, the microwave oscillation frequency is adjusted such that the ECR height is equal to a reference ECR height, and the microwave oscillation frequency is recorded. Accordingly, all devices have the same ECR height with respect to the above etching condition.

By applying the adjustment and the record of the oscillation frequency to each etching condition or each coil current, a database of the ECR height that is a reference for each device can be constructed. As a result, for each coil current, it is possible to detect at which microwave power a difference between the ECR height and the reference ECR height, that is, a machine difference occurs.

In addition, by expanding a range of the microwave oscillation frequency for application, a database of the relationship between the microwave oscillation frequency, the coil current, and the ECR height can be constructed. This database is a database corresponding to the coil current, the oscillation frequency, and the ECR height in FIG. 7 of the first embodiment. Accordingly, it is easy to control the microwave oscillation frequency.

There is a method of adjusting the microwave oscillation frequency such that plasma light emission and the VPP are the same as the reference even when there is no ECR height monitor.

In detail, a gas type and a pressure which are references are determined, and the discharge etching processing is performed using the microwave power (low power region, for example, 200 watts is desirable), the coil current, and the RF bias power as one condition.

It is assumed that the configuration of the radio frequency power supply and the RF bias power is completed, but the variation of the ECR height can be checked by a procedure of correcting the microwave oscillation frequency such that the VPP at that time is the same in each device, and the machine difference thus caused can be reduced.

When there is no difference in the ECR height, the plasma light emissions are theoretically the same, and the light emission amounts detected by the upper light emission amount measurement device 202 and the lower light emission amount measurement device 203 are also the same. However, since the detected light emission amount changes due to reasons such as an etching product adhering to a view boat part, the ECR height cannot be made the same only by making the plasma light emission amounts the same.

That is, it is desirable to correct the microwave oscillation frequency by checking the VPP and the plasma light emission in combination.

The invention made by the present inventor is described above in detail based on the embodiments of the invention, but the invention is not limited to the above embodiments, and various changes can be made within the scope not departing from the gist of the invention.

The invention is not limited to the embodiments described above, and includes various modifications. For example, the embodiments described above is described in detail for easy understanding of the invention, and the invention is not necessarily limited to those including all configurations described above.

In addition, a part of the configuration of one embodiment can be replaced with the configuration of another embodiment, and the configuration of another embodiment can be added to the configuration of the one embodiment. Other configurations may be added to, deleted from or replaced with a part of a configuration of each embodiment. It should be noted that each member and the relative size described in the drawings are simplified and idealized in order to easily understand the invention, and are more complicated in terms of implementation.

The invention is suitable for the plasma processing apparatus using the microwave ECR, but is not limited thereto, and is applicable to an ECR film forming device or asher.

REFERENCE SIGN LIST 101 processing chamber
101a chamber
101b side wall
102 shower plate
103 quartz top plate
104 cavity resonator
105 waveguide
106 radio frequency power supply
107 control unit
108 gas supply mechanism
109 exhaust device
110 magnetic field forming coil (magnetic field forming unit)
110a upper coil
110b middle coil
110c lower coil
111 plasma
112 ECR plane
113 sample stage
114 wafer (sample)
115 dielectric film
116 conductor film
117 RF bias power supply
118 matching circuit
119 camera
120 VPP monitor
121 control unit
130 light emission amount measurement device
200 image (image data)
201 scale
202 upper light emission amount measurement device (first spectrometer)
203 lower light emission amount measurement device (second spectrometer)
204 light emission
301 edge
401 slit
402 light receiving element
403 curve
601, 602, 603, 604, 605 curve
801, 802, 803 image
804 relationship curve

The invention claimed is:

1. A plasma processing apparatus comprising:
a processing chamber where a sample is processed using plasma;
a radio frequency power supply configured to supply a radio frequency power for generating the plasma;
a sample stage on which the sample is placed;
a magnetic field forming mechanism configured to form a magnetic field in the processing chamber; and
a control unit configured to, based on received image data of the plasma, monitor a height of an electron cyclotron resonance (ECR) plane of the plasma generated in the processing chamber, said plasma being generated by an interaction between the radio frequency power and the magnetic field, and to control a frequency of the radio frequency power such that the monitored height of the ECR plane becomes a predetermined height by adjusting the frequency.

2. The plasma processing apparatus according to claim 1, further comprising:
a monitor mechanism configured to monitor the ECR plane height, wherein
the monitor mechanism includes a camera configured to capture an image data of the plasma from a horizontal direction or an oblique direction, a first spectrometer configured to obtain a light emission intensity of the plasma from above the ECR plane, and a second spectrometer configured to obtain the light emission intensity of the plasma from below the ECR plane.

3. The plasma processing apparatus according to claim 1, wherein
the control unit determines the ECR plane height by using the image data of the plasma and a light emission intensity distribution of the plasma in a height direction of the processing chamber.

4. The plasma processing apparatus according to claim 1, wherein
the magnetic field forming mechanism includes a coil configured to form the magnetic field, and
the control unit is configured to control the frequency of the radio frequency power to correct a variation of the ECR plane height, due to a response delay of a current flowing through the coil, with respect to a predetermined value.

5. The plasma processing apparatus according to claim 1, wherein
the radio frequency power supply is a solid microwave power supply.

6. An electron cyclotron resonance (ECR) height monitor comprising:
a controller configured to monitor a height of an electron cyclotron resonance (ECR) plane generated in a processing chamber, said plasma being generated by an interaction between a radio frequency power for generating plasma and a magnetic field, wherein
the ECR plane height being monitored based on a captured image data of the plasma and a light emission intensity distribution of the plasma in a height direction of a processing chamber where the plasma is generated.

7. A plasma processing method for processing a sample by using plasma, the plasma processing method comprising:
a step of monitoring a height of an electron cyclotron resonance (ECR) plane generated in a processing chamber, said plasma being generated by an interaction between a radio frequency power for generating the plasma and a magnetic field, and said monitoring being based on a captured image data of the plasma; and a step of controlling a frequency of the radio frequency power such that the monitored ECR plane height becomes a predetermined height by adjusting the frequency.

8. The plasma processing method according to claim 7, wherein
when the frequency of the radio frequency power is changed by a predetermined amount, a value of a current flowing through a coil for forming the magnetic field is controlled such that the ECR plane height is equal to or higher than the predetermined height.

9. The plasma processing method according to claim 8, wherein
when switching between plasma processing conditions, the current flowing through the coil is set to the controlled current value before said switching occurs.

* * * * *